(12) United States Patent
Kim

(10) Patent No.: US 9,019,789 B2
(45) Date of Patent: Apr. 28, 2015

(54) SEMICONDUCTOR INTEGRATED CIRCUIT HAVING DIFFERENTIAL SIGNAL TRANSMISSION STRUCTURE AND METHOD FOR DRIVING THE SAME

(71) Applicant: SK Hynix Inc., Icheon-si (KR)

(72) Inventor: Ki-Up Kim, Icheon-si (KR)

(73) Assignee: SK Hynix Inc., Icheon (KR)

( * ) Notice: Subject to any disclaimer, the term of this patent is extended or adjusted under 35 U.S.C. 154(b) by 165 days.

(21) Appl. No.: 13/717,466

(22) Filed: Dec. 17, 2012

(65) Prior Publication Data

US 2014/0064007 A1 Mar. 6, 2014

(30) Foreign Application Priority Data

Aug. 29, 2012 (KR) .................. 10-2012-0095080

(51) Int. Cl.
| | |
|---|---|
| *G11C 7/02* | (2006.01) |
| *G11C 7/22* | (2006.01) |
| *G11C 11/34* | (2006.01) |
| *G11C 7/06* | (2006.01) |
| *G11C 7/08* | (2006.01) |
| *G11C 7/10* | (2006.01) |
| *G11C 11/4091* | (2006.01) |
| *G11C 11/4096* | (2006.01) |

(52) U.S. Cl.
CPC *G11C 7/062* (2013.01); *G11C 7/08* (2013.01); *G11C 7/1048* (2013.01); *G11C 7/1069* (2013.01); *G11C 7/1096* (2013.01); *G11C 11/4091* (2013.01); *G11C 11/4096* (2013.01)

(58) Field of Classification Search
CPC ..................... G11C 11/4091; G11C 2207/065; G11C 11/4074; G11C 2207/2227; G11C 29/026
USPC ................. 365/189.07, 189.15, 189.21, 207
See application file for complete search history.

(56) References Cited

U.S. PATENT DOCUMENTS

| | | | |
|---|---|---|---|
| 6,084,811 A | * | 7/2000 | Dorney .................... 365/189.15 |
| 6,449,191 B1 | * | 9/2002 | Lin et al. .................. 365/185.21 |
| 2006/0171225 A1 | * | 8/2006 | Chol et al. .................... 365/207 |

FOREIGN PATENT DOCUMENTS

KR 100182966 B1 12/1998

\* cited by examiner

*Primary Examiner* — Richard Elms
*Assistant Examiner* — Ajay Ojha

(57) ABSTRACT

A semiconductor integrated circuit includes an input data line pair, a sense amplifier configured to sense and amplify data loaded in the input data line pair and transmit the amplified data to an output data line pair, in response to a control signal, and a sense amplification controller configured to sense an amplification level of the output data line pair, limit an activation period of a sense amplification enable signal, and output the limited signal as the control signal.

14 Claims, 3 Drawing Sheets

SEMICONDUCTOR INTEGRATED CIRCUIT HAVING DIFFERENTIAL SIGNAL TRANSMISSION STRUCTURE AND METHOD FOR DRIVING THE SAME

CROSS-REFERENCE TO RELATED APPLICATIONS

The present application claims priority of Korean Patent Application No. 10-2012-0095080, filed on Aug. 29, 2012, which is incorporated herein by reference in its entirety.

BACKGROUND

1. Field

Exemplary embodiments of the present invention relate to a semiconductor integrated circuit design, and more particularly, to a semiconductor integrated circuit having a differential signal transmission structure and a method for driving the same.

2. Description of the Related Art

In general, a signal transmission line used in a semiconductor integrated circuit is referred to as a bus. The bus may be divided into a single-ended type using one line and a differential type using two lines. The differential type bus has an advantage in that it has small current consumption because the signal swing thereof is smaller than that of the single-ended type bus.

Meanwhile, a semiconductor integrated circuit typically uses a hierarchical bus structure. For example, a memory device such as a DRAM uses a hierarchical bus structure divided into a global data bus, a local data bus, and a segment data bus, in order to transmit data between a memory cell and an input/output interface. Among the buses, the global data bus is implemented with a single-ended type bus, and the local data bus and the segment data bus are implemented with a differential type bus.

FIG. 1 is a block diagram illustrating a data read path of a conventional DRAM.

Referring to FIG. 1, the data read path of the conventional DRAM includes a memory cell 100, a bit line sense amplifier (BLSA) 120, a local sense amplifier (LSA) 140, and a global sense amplifier (IOSA) 160. The BLSA 120 is configured to sense and amplify data of the memory cell 100, loaded on a bit line pair BL and BLB. The LSA 140 is configured to sense and amplify an output signal of the BLSA 120, loaded on a segment data line pair SIO and SIOB, in response to an LSA enable signal LSA_EN. The IOSA 160 is configured to sense and amplify an output signal of the LSA 140, loaded on a local data line pair LIO and LIOB, and transmit the amplified signal to a global data line GIO.

Here, the LSA 140 amplifies the data loaded on the segment data line pair SIO and SIOB and transmits the amplified data to the local data line pair LIO and LIOB, during a read operation of the DRAM.

With the increase in a degree of integration of a DRAM, loading on the local data line pair LIO and LIOB may increase, thus reducing a voltage difference between the local data line pair LIO and LIOB. Since a sensing margin of the IOSA 160 is increased by the amplification operation of the LSA 140, it is possible to advance a point of time at which the IOSA 160 is driven.

However, since the employment of the LSA 140 increases a swing width of the local data line pair LIO and LIOB having a large load, the current consumption inevitably increases.

FIG. 2 is a waveform diagram illustrating the LSA enable signal LSA_EN and voltage levels on the data line pair LIO and LIOB over time in the conventional DRAM.

The operation of the LSA 140 is controlled by the LSA enable signal LSA_EN. When the LSA enable signal LSA_EN is activated to a logic high level, the LSA 140 is enabled to develop the local data line pair LIO and LIOB precharged with a core voltage level VCORE.

Typically, an enable period of the LSA 140 is set based on a voltage difference on the local data line pair LIO and LIOB when a PVT (process, voltage, and temperature) condition is the worst. Therefore, when the PVT condition is favorable, the swing width of the local data line pair LIO and LIOB may dramatically increase, and thus effecting a precharge current as well as a sensing current. Furthermore, when the swing width of the local data line pair LIO and LIOB increases, a precharge time for the local data line pair LIO and LIOB increases, resulting in the degradation of an operation speed.

SUMMARY

An embodiment of the present invention is directed to a semiconductor integrated circuit capable of minimizing a swing width of an output data line pair in a differential input/output transmission line structure, and a method for driving the same.

Another embodiment of the present invention is directed to a semiconductor integrated circuit capable of minimizing a swing width of a local data line pair driven by a local sense amplifier, and a method for driving the same.

In accordance with an embodiment of the present invention, a semiconductor integrated circuit includes: an input data line pair; a sense amplifier configured to sense and amplify data loaded in the input data line pair and transmit the amplified data to an output data line pair, in response to a control signal; and a sense amplification controller configured to sense an amplification level of the output data line pair, limit an activation period of a sense amplification enable signal, and output the limited signal as the control signal.

In accordance with another embodiment of the present invention, a method for driving a semiconductor integrated circuit, includes: generating a sense amplification enable signal activated during a predetermined period in response to a command; sensing an amplification level of an output data line pair and generating a control signal obtained by limiting an activation period of the sense amplification enable signal; and sensing and amplifying data loaded in an input data line pair and transmitting the amplified data to the output data line pair, in response to a control signal.

In accordance with yet another embodiment of the present invention, a semiconductor integrated circuit includes: a memory cell; a bit line sense amplifier (BLSA) configured to sense and amplify data of the memory cell, loaded in a bit line pair; a local sense amplifier (LSA) configured to sense and amplify an output signal of the bit line sense amplifier, loaded in a first local data line pair, and transmit the amplified signal to a second local data line pair, in response to a control signal; a global sense amplifier (IOSA) configured to sense and amplify the signal loaded in the second local data line pair and transmit the amplified signal to a global data line; and an LSA controller configured to sense an amplification level of the second local data line pair, limit an activation period of an LSA enable signal, and output the limited signal as the control signal.

In accordance with still another embodiment of the present invention, a method for driving a semiconductor integrated circuit includes: sensing and amplifying data of a memory cell, loaded in a bit line pair, and transmitting the amplified data to a segment data line pair; generating an LSA enable signal activated during a predetermined period in response to a read command; sensing an amplification level of a local data line pair and generating a control signal obtained by limiting an activation period of the LSA enable signal; sensing and amplifying the data loaded in the segment data line pair and transmitting the amplified data to the local data line pair, in response to a control signal; and sensing and amplifying the signal loaded in the local data line pair and transmitting the amplified signal to a global data line.

DETAILED DESCRIPTION

Figure 1:
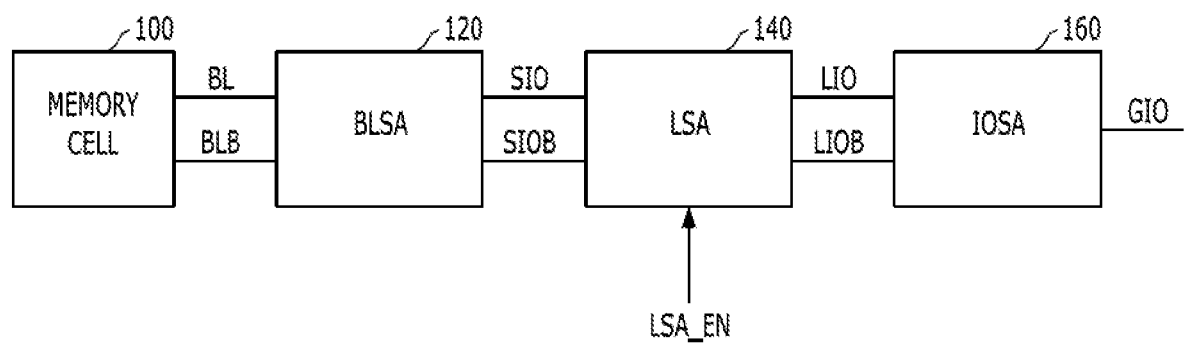
FIG. 1 is a block diagram illustrating a data read path of a conventional DRAM.
Figure 2:
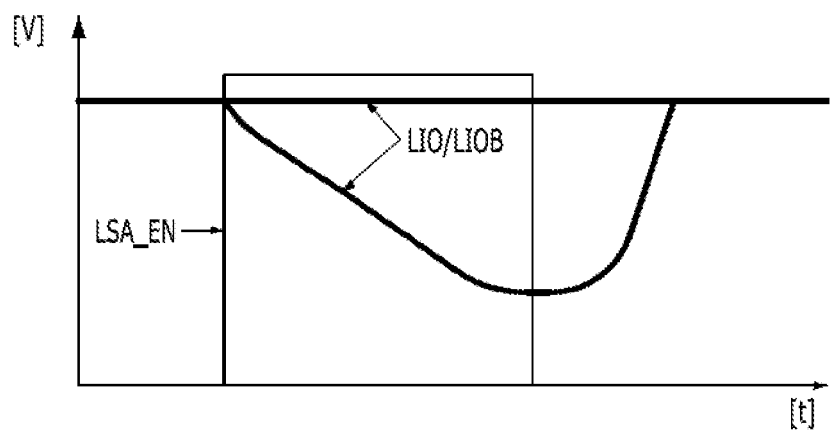
FIG. 2 is a waveform diagram illustrating an LSA enable signal and voltage levels on a data line pair over time in the conventional DRAM.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
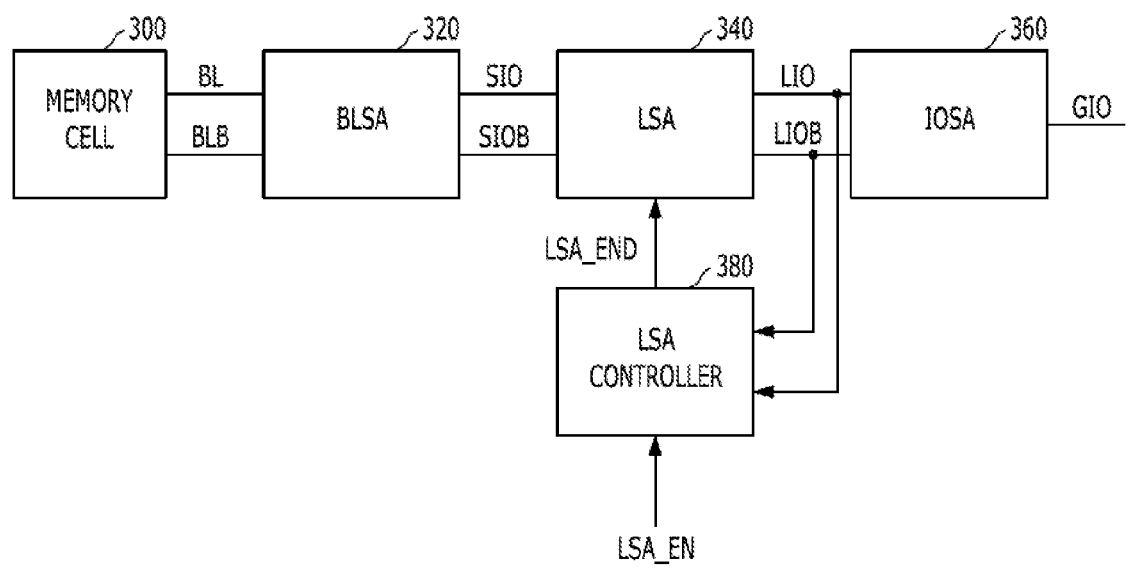
FIG. 3 is a block diagram illustrating a data read path of a DRAM in accordance with an embodiment of the present invention.

FIG. 3 is a block diagram illustrating a data read path of a DRAM in accordance with an embodiment of the present invention.

Referring to FIG. 3, the data read path of the DRAM in accordance with the embodiment of the present invention includes a memory cell 300, a bit line sense amplifier (BLSA) 320, a local sense amplifier (LSA) 340, a global sense amplifier (IOSA) 360, and an LSA controller 380. The BLSA 320 is configured to sense and amplify data of the memory cell 300, loaded on a bit line pair BL and BLB. The LSA 340 is configured to sense and amplify an output signal of the BLSA 320, loaded on a segment data line pair SIO and SIOB, in response to a control signal LSA_END. The IOSA 360 is configured to sense and amplify an output signal of the LSA 340, loaded on a local data line pair LIO and LIOB, and transmit the amplified signal to a global data line GIO. The LSA controller 380 is configured to detect an amplification level of voltages on the local data line pair LIO and LIOB, limit an activation period of an LSA enable signal LSA_EN based on the detected amplification level, and output the LSA enable signal LSA_EN with the limited activation period as the control signal LSA_END.

During a precharge period, the local data line pair LIO and LIOB is precharged to a core voltage level VCORE.

After that, if a read command is applied, the LSA enable signal LSA_EN is activated for a predetermined period, and thus the local data line pair LIO and LIOB starts to be developed. In an embodiment, depending on the polarity of data stored in the memory cell 300, any one of the local data line pair LIO and LIOB maintains a precharge state, e.g., the core voltage level VCORE, while the voltage level of the other of the local data line pair LIO and LIOB drops.

Meanwhile, as the local data line pair LIO and LIOB develops to a predetermined voltage level, the LSA controller 380 detects the developed voltage level on the local data line pair LIO and LIOB, limits the activation period of the LSA enable signal LSA_EN according to whether the detected voltage level has reached the predetermined level or not, and outputs the LSA enable signal LSA_EN with the limited activation period as the control signal LSA_END. In an embodiment, the predetermined level of the local data line pair LIO and LIOB may be set to a minimum level or more, which may be sensed by the IOSA 360 at a rear stage.

That is, an activation point of time of the control signal LSA_END occurs at substantially the same time as an activation point of time of the LSA enable signal LSA_EN, and a deactivation point of time of the control signal LSA_END occurs at substantially the same time as (in the worst case) or sooner than a deactivation point of time of the LSA enable signal LSA_EN. As such, since the deactivation point of time of the control signal LSA_END may precede the deactivation point of time of the LSA enable signal LSA_EN, it is possible to reduce an unnecessary driving period of the LSA 340.

Figure 4:
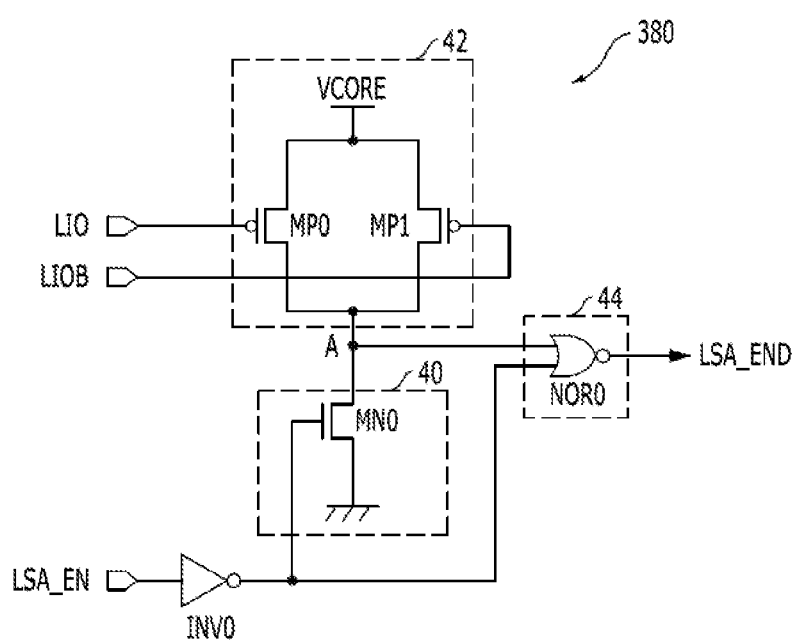
FIG. 4 is a circuit diagram of an LSA controller in FIG. 3.

FIG. 4 is a circuit diagram of the LSA controller 380 in FIG. 3.

Referring to FIG. 4, the LSA controller 380 includes a reset unit 40, a sensing driving unit 42, and an output unit 44. The reset unit 40 is configured to reset a sensing node A in response to the LSA enable signal LSA_EN. The sensing driving unit 42 is configured to sense voltage levels on the local data line pair LIO and LIOB and drive the sensing node A to a predetermined voltage level. The output unit 44 is configured to output the control signal LSA_END in response to the LSA enable signal LSA_EN and a voltage level of the sensing node A.

For reference, in an embodiment, an inverter INV0 may be used if, for example, the LSA enable signal LSA_EN is enabled at a high level.

Here, the reset unit 40 includes an NMOS transistor MN0 having a source coupled to a ground voltage terminal VSS, a drain coupled to the sensing node A, and a gate receiving an inverted LSA enable signal.

The sensing driving unit 42 includes a PMOS transistor MP0 that has a source coupled to a core voltage terminal VCORE, a drain coupled to the sensing node A, and a gate coupled to the local data line LIO. The sensing driving unit 42 also includes a PMOS transistor MP1 that has a source coupled to the core voltage terminal VCORE, a drain coupled to the sensing node A, and a gate coupled to the local data line bar LIOB.

The output unit 44 includes a NOR gate NOR0 configured to receive the inverted LSA enable signal and the voltage loaded on the sensing node A and output the control signal LSA_END.

Figure 5:
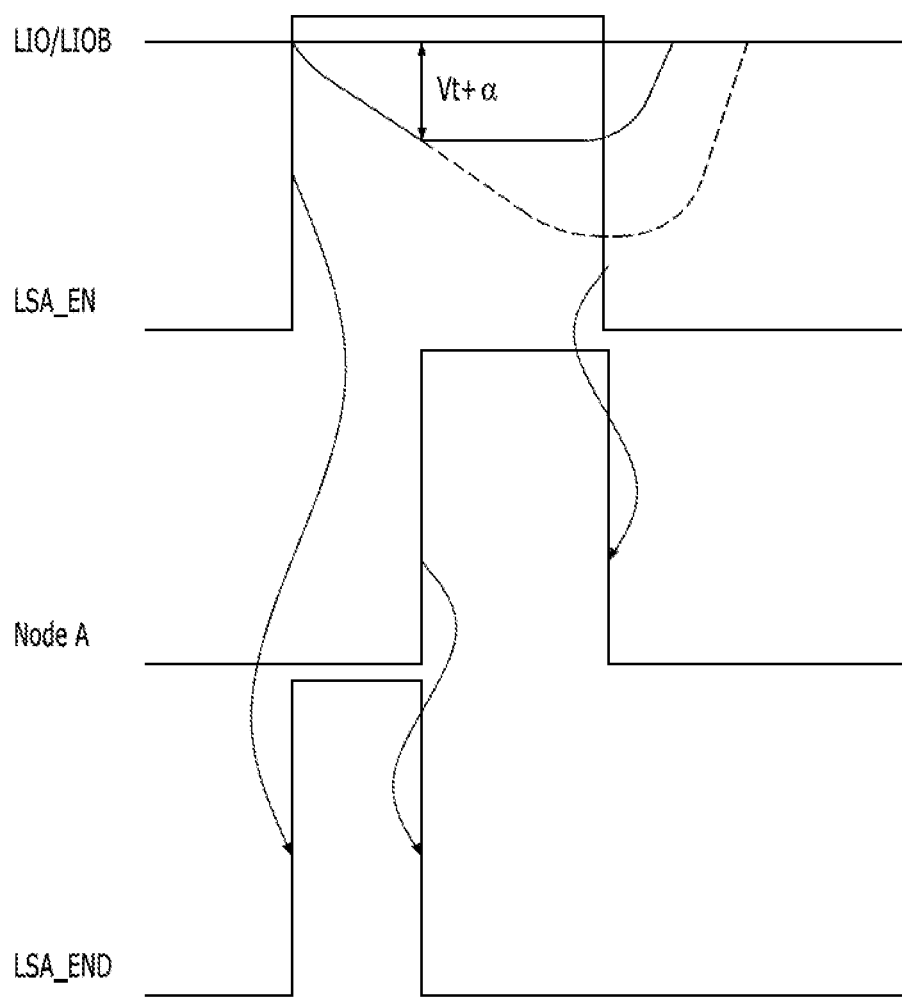
FIG. 5 is a waveform diagram illustrating an operation of the LSA controller in FIG. 4.

FIG. 5 is a waveform diagram illustrating an operation of the LSA controller 380 in FIG. 4.

During a precharge period, the local data line pair LIO and LIOB is precharged to the core voltage level VCORE, and the LSA enable signal LSA_EN is deactivated to a logic low level. Therefore, the NMOS transistor MN0 of the reset unit 40 is turned on, and the two PMOS transistors MP0 and MP1 of the sensing driving unit 42 are turned off. Accordingly, the sensing node A has a logic low level, and thus the control signal LSA_END also has a logic low level.

After that, if a read command is applied, the LSA enable signal LSA_EN is activated to a logic high level for a predetermined period. Therefore, the NMOS transistor MN0 of the reset unit 40 is turned off. When the LSA enable signal LSA_EN is activated to the logic high level, the LSA 340 is enabled to develop the local data line pair LIO and LIOB. That is, depending on the polarity of the data stored in the memory cell 300, any one of the local data line pair LIO and LIOB maintains the precharge state, e.g., the core voltage level VCORE, and a voltage level of the other of the local data line pair LIO and LIOB starts to drop. At this time, the sensing node A maintains a logic low level, and the LSA enable signal LSA_EN has a logic high level. Therefore, the control signal LSA_END moves to a logic high level.

As such, when a voltage difference between the local data line pair LIO and LIOB caused by amplification of the LSA 340 becomes (Vt+α), that is, greater than a transistor threshold voltage Vt, while the local data line pair LIO and LIOB is developed by the LSA 340, any one of the two PMOS transistors MP0 and MP1 of the sensing driving unit 42 is turned on. As a result, a voltage level of the sensing node A is rapidly pulled up. If the voltage level of the sensing node A moves to a sufficiently high level, the control signal LSA_END changes to a logic low level. The LSA 340 is activated or deactivated in response to the control signal LSA_END, and the activation period of the control signal LSA_END may be set to be shorter than the activation period of the LSA enable signal LSA_EN.

Then, when the LSA enable signal LSA_EN moves to a logic low level, the NMOS transistor MN0 of the reset unit 40 is turned on again to pull down the sensing node A, and the control signal LSA_END maintains a logic low level.

In accordance with an embodiment of the present invention, when the local data line pair LIO and LIOB is developed to have a voltage difference (Vt+α) that is greater than the transistor threshold voltage Vt, the LSA 340 may be disabled. That is, an activation period of the LSA 340 may be reduced compared to the prior art in which the activation of the LSA is controlled by the LSA enable signal LSA_EN. Specifically, in accordance with an embodiment of the present invention, the activation point of time of the control signal LSA_END is substantially the same as the activation point of time of the LSA enable signal LSA_EN, and the deactivation point of time of the control signal LSA_END may occur before the deactivation point of time of the LSA enable signal LSA_EN, except in the worst case. As a result, the activation period of the control signal LSA_END becomes shorter than that of the LSA enable signal LSA_EN, and thus it is possible to reduce an unnecessary driving period of the LSA 340.

In accordance with an embodiment of the present invention, it is possible to reduce a swing width of an output data line pair in a differential input/output transmission line pair. In particular, it is possible to minimize the swing width of the local data line pair driven by the LSA. Therefore, the unnecessary consumption of the sensing current and the precharge current of the sense amplifier may be reduced, and the precharge time of the sense amplifier may also be reduced to improve operation speed characteristics.

While the present invention has been described with respect to specific embodiments, it will be apparent to those skilled in the art that various changes and modifications may be made without departing from the spirit and scope of the invention as defined in the appended claims.

For example, the logic in accordance with an embodiment of the present invention may be substituted with different logic or omitted according to the types and activation levels of signals used in the logic.

Furthermore, as described above, a reference voltage level for sensing the development level of the local data line pair LIO and LIOB is set to (Vt+α), which is greater than a transistor threshold voltage Vt. However, the reference voltage level may be set to a minimum voltage level or more capable of being sensed by the IOSA at a rear stage.

In the above-described embodiments of the present invention, the LSA was used as an example for illustration. However, the present invention may be applied to another sense amplifier having a differential input/output transmission line structure.

Furthermore, it has been described that the core voltage VCORE is used as an excitation voltage source. However, another voltage source such as a power supply voltage VDD may be used instead of the core voltage VCORE.

Those skilled in the art will recognize that other changes and modifications may be made without departing from the spirit and scope of the invention as defined in the following claims

What is claimed is:

1. A semiconductor integrated circuit, comprising:
   an input data line pair;
   a sense amplifier configured to sense and amplify data loaded on the input data line pair and output the amplified data to an output data line pair, in response to a control signal; and
   a sense amplification controller configured to detect an amplification level on the output data line pair, and output the control signal for controlling the sense amplifier based on a sense amplification enable signal and the detected amplification level,
   wherein the sense amplification controller comprises:
      a reset unit configured to receive the sense amplification enable signal and reset a first input node of an output unit in response to the sense amplification enable signal;
      a sensing driving unit configured to sense voltage levels of the output data line pair and drive the first input node of the output unit to a predetermined voltage level; and
      the output unit configured to output the control signal in response to the sense amplification enable signal provided to a second input node and a voltage on the first input node, and provide the control signal to the sense amplifier.

2. The semiconductor integrated circuit of claim 1, wherein the sense amplification enable signal is activated during a predetermined period in response to a command.

3. The semiconductor integrated circuit of claim 1, wherein the reset unit comprises an NMOS transistor having a source coupled to a ground voltage terminal, a drain coupled to the first input node, and a gate to receive an inverted sense amplification enable signal.

4. The semiconductor integrated circuit of claim 1, wherein the sensing driving unit comprises:
   a first PMOS transistor having a source coupled to a power supply voltage terminal, a drain coupled to the first input node, and a gate coupled to one of the output data line pair; and
   a second PMOS transistor having a source coupled to the power supply voltage terminal, a drain coupled to the first input node, and a gate coupled to the other of the output data line pair.

5. The semiconductor integrated circuit of claim 1, wherein the output unit comprises a NOR gate configured to output the control signal based on the sense amplification enable signal and the voltage of the first input node.

6. The semiconductor integrated circuit of claim 1, wherein the control signal is configured to limit an activation period of the sense amplification enable signal to thereby deactivate the sense amplifier, if the detected amplification level reaches a predetermined voltage level.

7. The semiconductor integrated circuit of claim 6, wherein the predetermined voltage level corresponds to a minimum voltage difference of the output data line pair that is capable of being sensed by an amplifier at a rear stage of the sense amplifier.

8. A semiconductor integrated circuit, comprising:
a memory cell;
a bit line sense amplifier (BLSA) configured to sense and amplify data of the memory cell, loaded on a bit line pair;
a local sense amplifier (LSA) configured to sense and amplify an output signal of the bit line sense amplifier, loaded on a first local data line pair, and output a first amplified signal to a second local data line pair, in response to a control signal;
a global sense amplifier (IOSA) configured to sense and amplify the signal loaded on the second local data line pair and output a second amplified signal to a global data line; and
an LSA controller configured to detect a voltage level of the first amplified signal, and output the control signal for controlling the LSA based on a LSA enable signal and the detected voltage level,
wherein the LSA controller comprises:
a reset unit configured to reset a first input node of an output unit in response to the LSA enable signal;
a sensing driving unit configured to sense the voltage level of the first amplified signal and drive the first input node of the output unit to a predetermined voltage level; and
the output unit configured to output the control signal in response to the LSA enable signal provided to a second input node and a voltage level of the first input node, and provide the control signal to the LSA.

9. The semiconductor integrated circuit of claim 8, wherein the LSA enable signal is activated during a predetermined period in response to a read command.

10. The semiconductor integrated circuit of claim 8, wherein the reset unit comprises an MOS transistor having a source coupled to a ground voltage terminal, a drain coupled to the first input node, and a gate to receive an inverted LSA enable signal.

11. The semiconductor integrated circuit of claim 8, wherein the sensing driving unit comprises:
a first PMOS transistor having a source coupled to a core voltage terminal, a drain coupled to the first input node, and a gate coupled to one of the second output data line pair; and
a second PMOS transistor having a source coupled to the core voltage terminal, a drain coupled to the first input node, and a gate coupled to the other of the second output data line pair.

12. The semiconductor integrated circuit of claim 8, wherein the output unit comprises a NOR gate configured to output the control signal based on the LSA enable signal and the voltage level on the first input node.

13. The semiconductor integrated circuit of claim 8, wherein the control signal is configured to limit an activation period of the LSA enable signal to deactivate the LSA, if the detected voltage level reaches a predetermined voltage level.

14. The semiconductor integrated circuit of claim 13, wherein the predetermined voltage level corresponds to a minimum voltage difference on the second local data line pair that is capable of being sensed by the IOSA.

* * * * *